(12) United States Patent
Terauchi et al.

(10) Patent No.: US 6,653,739 B2
(45) Date of Patent: Nov. 25, 2003

(54) SEMICONDUCTOR DEVICE

(75) Inventors: Takashi Terauchi, Tokyo (JP);
Yoshinori Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/901,113

(22) Filed: Jul. 10, 2001

(65) Prior Publication Data

US 2002/0079536 A1 Jun. 27, 2002

(30) Foreign Application Priority Data

Dec. 27, 2000 (JP) ........................................ 2000-397938

(51) Int. Cl.$^7$ .......................... H01L 23/52; H01L 23/48; H01L 27/108
(52) U.S. Cl. ..................... 257/774; 257/773; 257/734; 257/382; 257/908
(58) Field of Search ............................. 257/377, 382–3, 257/750, 387, 332, 908, 774, 773, 734

(56) References Cited

U.S. PATENT DOCUMENTS

| | | | | |
|---|---|---|---|---|
| 6,037,216 A | * | 3/2000 | Liu et al. ..................... | 438/253 |
| 6,046,489 A | * | 4/2000 | Yamaguchi ................. | 257/532 |
| 6,166,428 A | * | 12/2000 | Mehta et al. ................ | 257/636 |
| 6,245,669 B1 | * | 6/2001 | Fu et al. ..................... | 438/636 |
| 6,255,701 B1 | * | 7/2001 | Shimada ..................... | 257/384 |

FOREIGN PATENT DOCUMENTS

| | | | | |
|---|---|---|---|---|
| JP | 10-191607 A1 | * | 1/2000 | ......... H01L/21/768 |
| JP | 2000-21983 | | 1/2000 | |

OTHER PUBLICATIONS

S. Wolf and R.N. Tauber, Silicon Processing for the VLSI Era, vol.—Processing Technology, Second Edition, Lattice Press, Sunset Beach, California (USA); pp. 202–203 (1986/2000).*
U.S. patent application Ser. No. 09/215,203, filed Dec. 18, 1998, Terauchi et al. (Our Ref. No. 50090–101).

* cited by examiner

Primary Examiner—Nathan Flynn
Assistant Examiner—Johannes P Mondt
(74) Attorney, Agent, or Firm—McDermott, Will & Emery

(57) ABSTRACT

A contact plug 26 formed between adjacent two wirings 14 according to a self-aligning manner is provided. An interlayer oxide film 12 is provided on a substrate layer 10 conductive to the bottom face of the contact plug. A lower insulating film 32 formed of a nitride based insulating film is provided so as to cover the entire surface of the interlayer oxide film 12 except for the contact hole portion. A wiring 12, an upper insulating film 16 formed of a nitride based insulating film, and sidewalls 18 formed of a nitride based insulating film are provided over the lower insulating film 32. The contact hole has a diameter larger than the interval defined between the wirings 14 in the same layer as the interlayer oxide film 12.

17 Claims, 13 Drawing Sheets

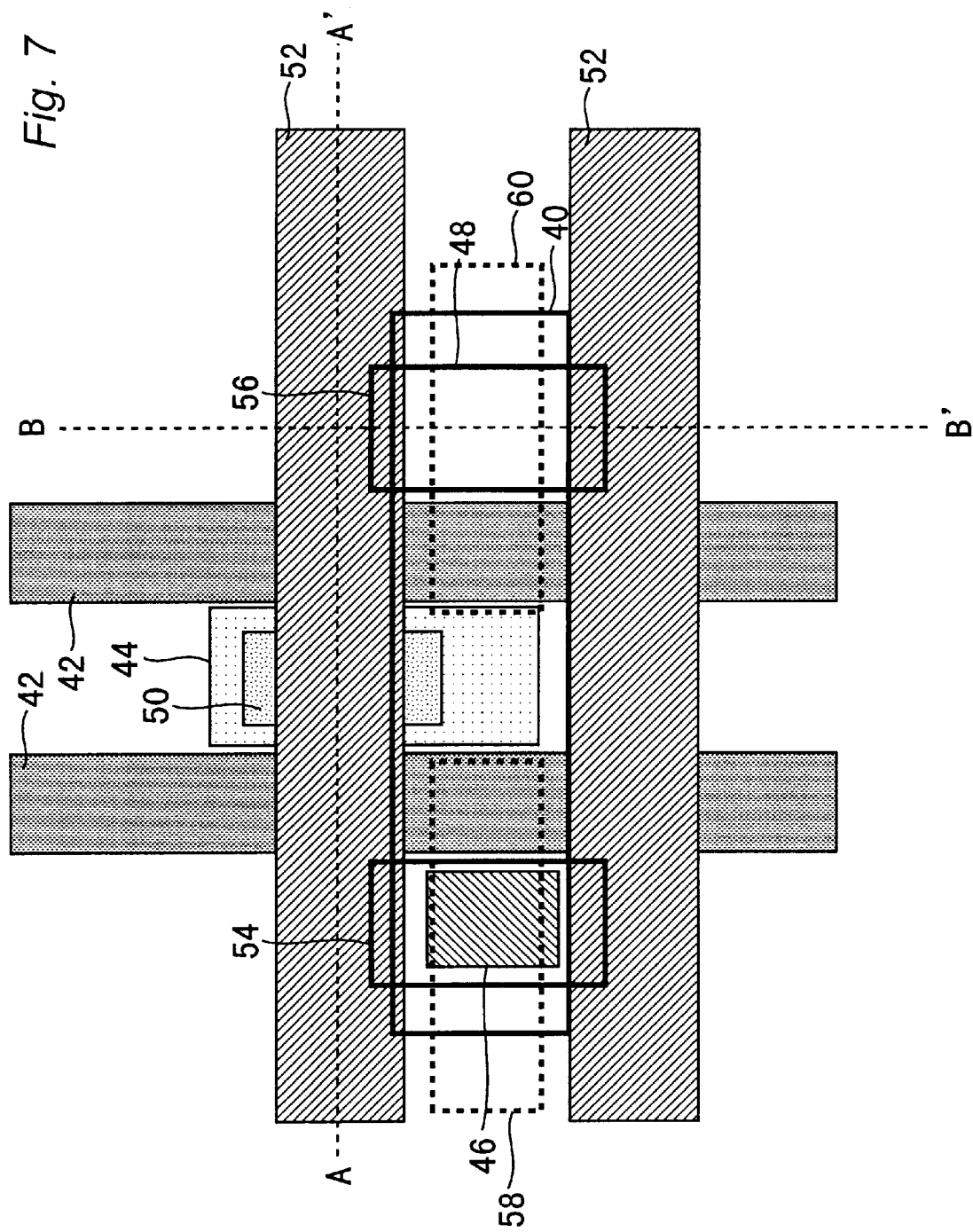

A-A' SECTIONAL VIEW

B-B' SECTIONAL VIEW

A-A' SECTIONAL VIEW

B-B' SECTIONAL VIEW

A-A' SECTIONAL VIEW

B-B' SECTIONAL VIEW

A-A' SECTIONAL VIEW

B-B' SECTIONAL VIEW

A-A' SECTIONAL VIEW

B-B' SECTIONAL VIEW

A-A' SECTIONAL VIEW

B-B' SECTIONAL VIEW

A-A' SECTIONAL VIEW (C)

B-B' SECTIONAL VIEW (D)

A-A' SECTIONAL VIEW

B-B' SECTIONAL VIEW

A-A' SECTIONAL VIEW

B-B' SECTIONAL VIEW

A-A' SECTIONAL VIEW

B-B' SECTIONAL VIEW

A-A' SECTIONAL VIEW

A-A' SECTIONAL VIEW

SEMICONDUCTOR DEVICE

BACKGROUND OF THE INVENTION

1. Field of the Invention

The present invention relates to a semiconductor device, and more particularly to a semiconductor device having a contact hole defined by a self-aligning manner.

2. Description of the Background Art

With an improvement in integration of a semiconductor device and the scaling-down of a memory cell, difficulties have recently been encountered in defining a contact between adjacent wirings without developing a short circuit in wiring. A technique called a self-aligning manner has heretofore been used as one method for defining a contact hole while preventing a short circuit developed in wiring.

FIGS. 1A through 1F respectively show a series of cross-sectional views for describing a conventional method of defining a contact hole by using a self-aligning manner. According to the conventional method, an interlayer oxide film 12 is first deposited on a semiconductor substrate 10 as shown in FIG. 1A. A silicon film 14 is deposited on the interlayer oxide film 12 and a nitride film 16 for protecting the silicon film 14 is further deposited thereon.

Next, the silicon film 14 and the nitride film 16 are patterned in desired wiring form as shown in FIG. 1B.

Afterwards, sidewalls 18 for protecting the side faces of each silicon film 14 are formed by a nitride film as shown in FIG. 1C. Each silicon film 14 patterned in wiring form is brought to a state of being covered with the nitride film at this stage.

After the sidewalls 18 have been formed, an interlayer oxide film 20 is deposited over the entire surface of a semiconductor wafer as shown in FIG. 1D. Next, a predetermined heat treatment is carried out to enhance the embedding characteristics and flatness of the interlayer oxide film 20.

As shown in FIG. 1E, a photoresist 22 is patterned onto the interlayer oxide film 20. Oxide-film etching for defining a contact hole 24 is executed with the photoresist 22 as a mask. This etching is carried out under a condition for removing an oxide film at a higher selectivity than that for the nitride film. Since, in this case, each of the nitride film 16 and sidewalls 18 functions as a stopper film for stopping the progress of the etching, the contact hole 24 can be defined up to the semiconductor substrate 10 without exposing each wiring to the inside of the contact hole 24 even when a opening of the photoresist 22 is wider than the interval between the wirings. A technique for defining the contact hole in place on a self-alignment basis in this way is called a "self-aligning manner".

The photoresist 22 is removed after the contact hole 24 has been defined. A silicon film is deposited over the entire surface of a semiconductor wafer so that the contact hole 24 is filled with silicon. The so-deposited silicon is patterned in desired shapes, so that such a contact plug 26 and a wiring 28 as shown in FIG. 1F are formed.

In the aforementioned conventional method, the etching for defining the contact hole 24 is carried out under the circumstances in which the side faces of each silicon film 14 patterned in wiring form have been covered with the sidewalls 18. In this case, the width of the contact hole 24 in the vicinity of a lower end thereof becomes narrower than the interval defined between the adjacent two sidewalls 18. According to the etching for defining the contact hole 24 by which an oxide film is anisotropically etched at a higher selectivity than that for the nitride film, the interlayer oxide film 12 located below the sidewalls 18 is etched in tapered form.

As a result, the diameter of the bottom of the contact hole 24 becomes drastically smaller than the interval defined between the adjacent silicon films 14, i.e., the interval defined between the wirings. Therefore, the conventional method is apt to cause problems such as an increase in contact resistance, degradation of drive capability of a transistor.

As a technique for solving the above problems, it can be used illustratively a method in which the contact hole 24 is defined by dry etching, and thereafter HF-system wet etching or the like is carried out to thereby retreat the interlayer oxide film 12.

However, as shown in FIG. 2, such wet etching may cause exposed portions 30 formed at parts of the bottoms of silicon films 14 so as to be exposed inside the contact hole 24. In this configuration, a short circuit would be developed between each silicon film 14 and the contact plug 26 which is formed inside the contact hole 24.

SUMMARY OF THE INVENTION

The present invention has been made to solve the above problems. An object thereof is to provide a semiconductor device having a contact hole whose bottom is scaled up, and a structure suited to prevent a short circuit from arising between a wiring and a contact plug.

The above objects of the present invention are achieved by a semiconductor device described below. The semiconductor device includes a contact hole defined between adjacent two wirings by a self-aligning manner. A contact plug is formed in the contact hole. A substrate layer is provided so as to be conductive to the bottom face of the contact plug. An interlayer oxide film is formed on the substrate layer. A lower insulating film formed of a nitride based insulating film is provided so as to cover the entire surface of the interlayer oxide film except for the contact hole portion. The two wirings are formed on the lower insulating film with the contact hole interposed therebetween. An upper insulating film formed of a nitride based insulating film is provided with the same width as the each wiring so as to cover the upper surface of the each wiring. The semiconductor device also includes sidewalls formed of a nitride based insulating film so as to cover the side faces of the each wiring and the side faces of the upper insulating film. The contact hole has an enlarged portion formed in the same layer as the interlayer oxide film, which has a diameter larger than an interval defined between the two wirings.

The above objects of the present invention are also achieved by a semiconductor device described below. The semiconductor device includes a contact hole defined between adjacent two wirings by a self-aligning manner. A contact plug is formed in the contact hole. A substrate layer is provided so as to be conductive to the bottom face of the contact plug. An interlayer oxide film is formed on the substrate layer. The two wirings are formed in a layer above the interlayer oxide film with the contact hole interposed therebetween. A lower insulating film formed of a nitride based insulating film is provided between the interlayer oxide film and the each wiring with the same width as the each wiring. An upper insulating film formed of a nitride based insulating film is provided so as to cover the upper surface of the each wiring with the same width as the each wiring. The semiconductor device also includes sidewalls formed of a nitride based insulating film so as to cover the side faces of the each wiring and the side faces of the upper and lower insulating films. The contact hole has a diameter larger than an interval defined between the two wirings within the same layer as the interlayer oxide film. The bottom face of the each sidewall is shifted toward the substrate layer by a predetermined length as compared with the bottom face of the lower insulating film.

The above objects of the present invention are further achieved by a semiconductor device described below. The semiconductor device includes a contact hole defined between adjacent two wirings by a self-aligning manner. A contact plug is formed in the contact hole. A substrate layer is provided so as to be conductive to the bottom face of the contact plug. An interlayer oxide film is formed on the substrate layer The two wirings are formed on the interlayer oxide film with the contact hole interposed therebetween. An upper insulating film formed of a nitride based insulating film is provided so as to cover the upper surface of the each wiring with the same width as the wiring. Sidewalls formed of a nitride based insulating film are provided so as to cover the side faces of the each wiring and the side faces of the upper insulating film. The semiconductor device also includes a short-circuit proof film formed of a single insulating material so as to cover the entire side face of the contact plug. The contact hole has a diameter larger than an interval defined between the two wirings within the same layer as the interlayer oxide film.

Other objects and further features of the present invention will be apparent from the following detailed description when read in conjunction with the accompanying drawings.

BRIEF DESCRIPTION OF THE DRAWINGS

FIG. 7 is a plan view for describing a structure of a semiconductor device according to a firth embodiment of the present invention;

DESCRIPTION OF THE PREFERRED EMBODIMENTS

First Embodiment

Figure 1A:
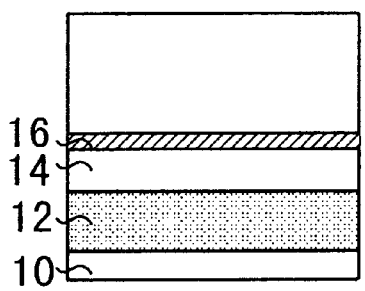
FIGS. 1A to 1F are cross-sectional views for describing a conventional manufacturing method.
Figure 1B:
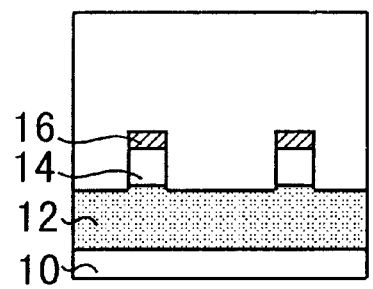
Figure 1C:
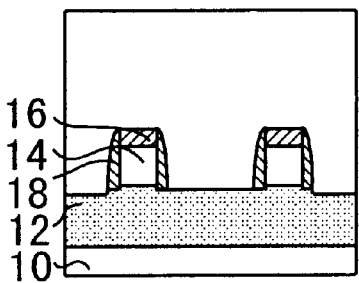
Figure 1D:
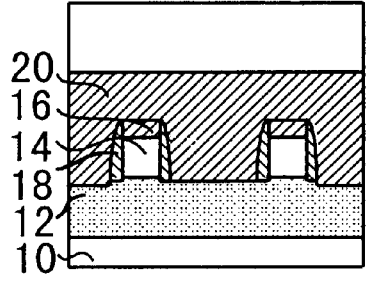
Figure 1E:
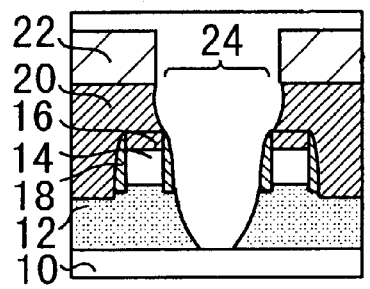
Figure 1F:
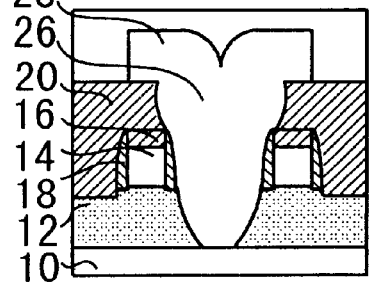

A first embodiment of the present invention will be explained below with reference to FIGS. 3A through 3H. Elements common in respective drawings are identified by the same reference numerals and the description of the common elements will therefore be omitted.

Figure 3A:
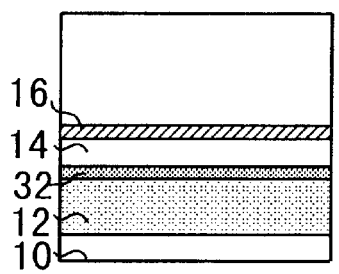
FIGS. 3A to 3H are cross-sectional views for describing a manufacturing method according to a first embodiment of the present invention.

In a manufacturing method of the present embodiment, an interlayer oxide film 12 is first formed on a semiconductor substrate 10 as shown in FIG. 3A. The interlayer oxide film 12 is formed by a reduced pressure or atmospheric pressure CVD method to a thickness of from 50 nm to 100 nm so as to contain no impurities.

A nitride film 32 is formed on the interlayer oxide film 12 with a thickness of from 20 nm to 100 nm. The film to be formed on the interlayer oxide film 12 may be a film capable of securing enough selectivity with respect to a silicon oxide film upon dry etching. Either a nitride oxide film or a laminated film of a nitride film and a nitride oxide film may be used as an alternative to the nitride film 32.

A silicon film 14 is formed on the nitride film 32 with a thickness of 50 nm to 200 nm. The silicon film 14 is a doped silicon film of polycrystalline silicon or amorphous silicon deposited by a CVD method and contains an impurity such as P or As or the like. The film to be formed on the nitride film 32 maybe a conductive film. As an alternative to the silicon film 14, a silicide film including a high melting point metal film such as Ti, TiN or W or the like, a laminated film of a doped silicon film and a silicide film, or a conductive metal film such as W, Al may be used.

A nitride film 16 is deposited on the silicon film 14. A thickness of 20 nm to 100 nm is provided for the nitride film 16 in a manner similar to the nitride film 32. In the present embodiment, a nitride oxide film, a laminated film of a nitride film and a nitride oxide film or the like may be substituted for the nitride film 16.

Figure 3B:
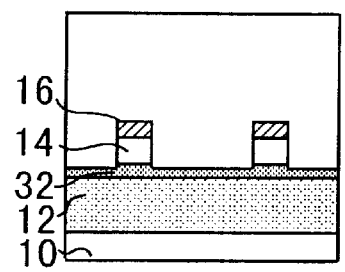

Dry etching such as a RIE method is carried out with an unillustrated photoresist as a mask to thereby pattern the nitride film 16 and the silicon film 14 in desired wiring shapes as shown in FIG. 3B. At this time, the dry etching is stopped at a stage in which the removal of the nitride film 32 advances midway, i.e., at the stage is which the nitride film 32 remains over the entire surface of a semiconductor wafer.

Figure 3C:
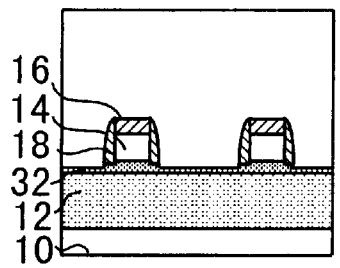

Next, a silicon nitride film is deposited over the entire surface of the semiconductor wafer with a thickness of 20 nm to 80 nm. The overall surface of the semiconductor wafer is etched back by dry etching such as the RIE method, whereby sidewalls 18 for covering the side faces of each silicon film 16 are formed as shown in FIG. 3C. The above etchback is finished before the nitride film 32 is perfectly removed. Thus, the nitride film 32 remains over the entire surface of the semiconductor wafer after the completion of the etchback.

Figure 3D:
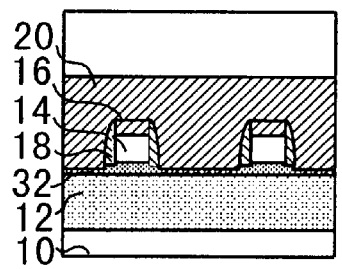

After the above-described etch back, an interlayer oxide film 20 is deposited over the entire surface of the semiconductor wafer as shown in FIG. 3D. The interlayer oxide film 20 is formed by depositing a silicon oxide film containing no impurity with a thickness of 500 nm to 1000 nm by the reduced pressure or atmospheric CVD method.

As an alternative to the non-doped silicon oxide film, a silicon oxide film doped with P or B may be deposited to form the interlayer oxide film 20. The embedding characteristics and flatness of the interlayer oxide film 20 can be enhanced by annealing the deposited silicon oxide film 20 in an $H_2O$, $O_2$ or $N_2$ atmosphere at a temperature within a range of 700° C. to 900° C. (reflow method).

The annealing in the $H_2O$ or $O_2$ atmosphere rather than in the $N_2$ atmosphere is efficient to enhance the embedding characteristics and flatness. However, since the lower portion of the silicon film 14 is in danger of oxidizing in the conventional manufacturing method, the annealing of the interlayer oxide film 20 has been carried out only in the $N_2$ atmosphere. On the other hand, since the nitride film 32 is formed so as to cover the bottom face of the silicon film 14 and cover the entire surface of the semiconductor wafer in the present embodiment, the silicon film 14 is not oxidized even if annealing is executed in the $H_2O$ or $O_2$ atmosphere. Thus, according to the manufacturing method of the present embodiment, $H_2O$ or $O_2$ gas can be used as an anneal gas whereby the embedding characteristics and flatness of the interlayer oxide film 20 can be improved sufficiently.

Figure 3E:
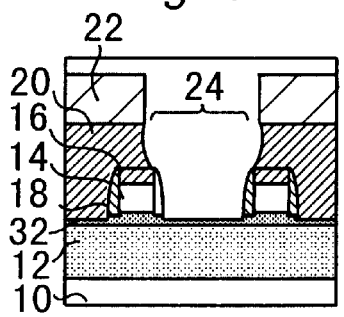

As shown in FIG. 3E, a photoresist 22 is patterned on the interlayer oxide film 20. The interlayer oxide film 20 is dry-etched by the RIE method or the like with the photoresist 22 as a mask to thereby define a contact hole 24. At this time, the above-described dry etching is done under the condition that the silicon oxide film can be removed at a higher selectivity than that for the silicon nitride film. Therefore, each of the nitride films 16 and 32 and the sidewalls 18 serves as a stopper film for stopping the progress of etching.

Figure 3F:
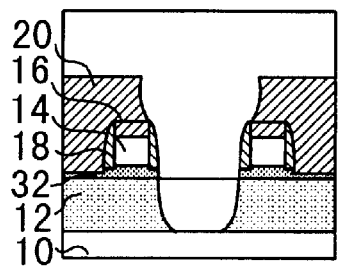

After the removal of the photoresist 22, the nitride film 32 exposed to the bottom of the contact hole 24 and the interlayer oxide film 12 located therebelow are next removed by dry etching such as the RIE method. As a result, the contact hole 24 is defined which reaches the surface of the semiconductor substrate 10 as shown in FIG. 3F.

In the present embodiment as described above, the nitride film 32 is capable of temporarily stopping the progress of etching in the process of defining the contact hole 24. Condition of the etching for defining the contact hole 24 with satisfactory accuracy can be controlled easier in a case where the progress of the etching is once stopped by the stopper film than in a case where the contact hole 24 is completely formed without stoppage of the etching. Therefore, according to the manufacturing method of the present embodiment, the contact hole 24 can be formed with satisfactory accuracy under simple condition control as compared with the case in which the nitride film 32, which functions as the stopper film, does not exist.

Figure 3G:
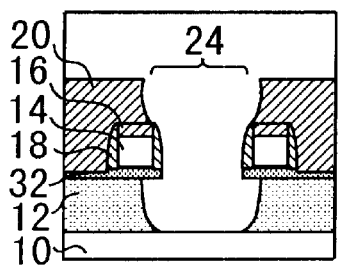

Next, wet etching using HF or the like is executed. As a result, the interlayer oxide film 12 is retreated as shown in FIG. 3G, whereby the diameter of the contact hole 24 is scaled up below the nitride film 32. The above-described wet etching is continued until the contact hole 24 exceeds an area just below the sidewalls 18 and reaches an area just below the silicon film 14. Since the nitride film 32 is formed under the silicon film 14 in the present embodiment, no part of the silicon film 14 is exposed to the inside of the contact hole 24 even if the contact hole 24 is enlarged in this way.

Figure 3H:
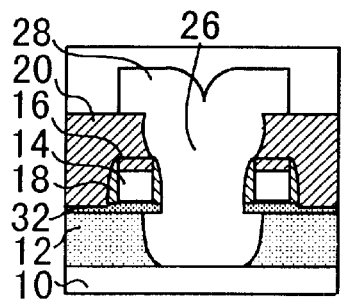

Next, a silicon film is deposited over the entire surface of a semiconductor wafer so that the contact hole 24 is filled with silicon. The silicon film is polycrystalline silicon or amorphous silicon doped with P or As and has a thickness of 50 nm to 200 nm on the interlayer oxide film 20. The so-deposited silicon is patterned in a desired shape by the dry etching such as the RIE method. As a result, a contact plug 26 and a wiring 28 are formed as shown in FIG. 3H.

Since the diameter of the bottom of the contact hole 24 is enlarged as described above in the present embodiment, a large contact area is ensured between the contact plug 26 and the semiconductor substrate 10. Therefore, the manufacturing method according to the present embodiment is capable of sufficiently reducing a contact resistance between the contact plug 26 and the semiconductor substrate 10 and effectively preventing problems such as an increase in contact resistance, a reduction in drive capability of each transistor.

Since the silicon film 14 is not exposed to the inside of the contact hole 24 in the present embodiment as described above, the silicon film 14 and the contact plug 26 can reliably be prevented from being short-circuited, regardless of the scale up of the contact hole 24. Thus, according to the manufacturing method of the present embodiment, a semiconductor device can stably be manufactured which is low in contact resistance and provides stable operating characteristics.

Second Embodiment

A second embodiment of the present invention will be explained below with reference to FIGS. 4A through 4G.

Figure 4A:
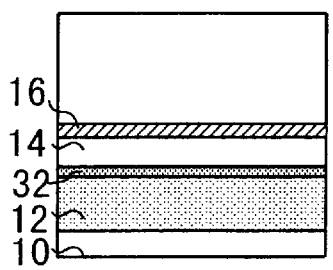
FIGS. 4A to 4G are cross-sectional views for describing a manufacturing method according to a second embodiment of the present invention.

In the manufacturing method according to the present embodiment, a laminated film of an interlayer oxide film 12, a nitride film 32, a silicon film 14 and a nitride film 16 is first formed over a semiconductor substrate 10 as shown in FIG. 4A in a manner similar to the first embodiment.

Figure 4B:
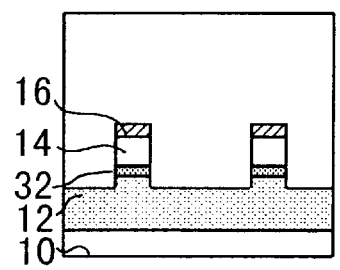

Dry etching such as a RIE method is carried out with an unillustrated photoresist as a mask to thereby pattern the nitride film 16, the silicon film 14 and the nitride film 32 in desired wiring shapes as shown in FIG. 4B. In this step, the dry etching is stopped at a stage in which the interlayer oxide film 12 has been etched so as to range from about 10 nm to about 50 nm in thickness. As a result, the nitride film 32 remains only under the silicon film 16 patterned to each wiring shape, and a step of from 10 nm to 50 nm is formed so as to exist between the bottom face of the nitride film 32 and each exposed surface of the interlayer oxide film 12.

Figure 4C:
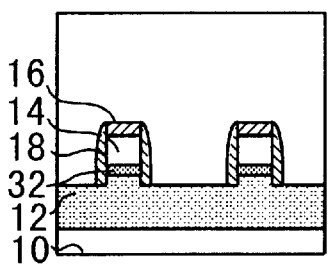

Next, a silicon nitride film is deposited over the entire surface of a semiconductor wafer with a thickness of 20 nm to 80 nm. The overall surface of the semiconductor wafer is etched back by dry etching such as the RIE method, so that sidewalls 18 for covering the side faces of each silicon film 16 are formed as shown in FIG. 4C. At this stage, a step of from 10 nm to 50 nm is formed between the bottom face of the nitride film 32 and the bottom face of each sidewall 18 in the present embodiment.

Figure 4D:
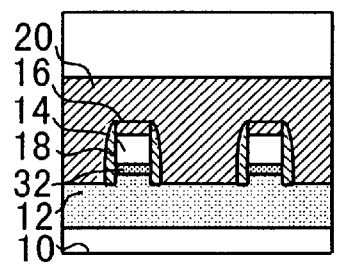

After the above-described etchback, an interlayer oxide film 20 is deposited over the entire surface of the semiconductor wafer as shown in FIG. 4D. Depositing a silicon oxide film containing no impurity with a thickness of 500 nm to 1000 nm forms the interlayer oxide film 20 by a reduced pressure or atmospheric CVD method.

As an alternative to the non-doped silicon oxide film, a silicon oxide film doped with P or B may be deposited to form the interlayer oxide film 20 in a manner similar to the first embodiment. In this case, the embedding characteristics and flatness of the interlayer oxide film 20 can be enhanced by executing anneal (reflow method) in an $H_2O$, $O_2$ or $N_2$ atmosphere. At the stage of the annealing referred to above, the nitride film 32 does not remain over the entire surface of the semiconductor wafer differently from the first embodiment. However, since the bottom face of the silicon film 14 is covered with the nitride film 32 even in the case of the present embodiment, annealing is allowed in the H₂O or O₂ atmosphere. Therefore, the manufacturing method according to the present embodiment can also provide excellent embedding characteristics and flatness for the interlayer oxide film 20 in a manner similar to the first embodiment.

Figure 4E:
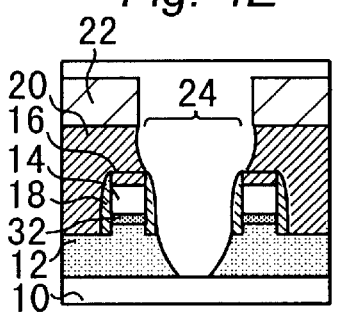

As shown in FIG. 4E, a photoresist 22 is patterned over the interlayer oxide film 20. The interlayer oxide film 20 is dry-etched by the RIE method or the like with the photoresist 22 as a mask, thereby defining a contact hole 24 therein. Since, at this time, the dry etching is done under the condition that the silicon oxide film can be removed at a higher selectivity than that for the silicon nitride film, each of the nitride film 16 and the sidewalls 18 functions as a stopper film for discontinuing the progress of the etching. Therefore, according to the dry etching described above, the contact hole 24 can be defined up to the semiconductor substrate 10 without exposing each silicon film 14.

Figure 4F:
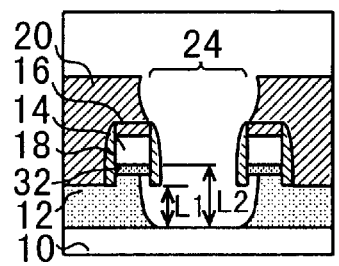

After the photoresist 22 has been removed, wet etching using HF or the like is carried out. As a result, the interlayer oxide film 12 is withdrawn as shown in FIG. 4F, whereby the diameter of the contact hole 24 is scaled up below the sidewalls 18 and the nitride film 32. The above-described wet etching is continued until the contact hole 24 exceeds an area just below the sidewalls 18 and reaches an area just under the silicon film 14. Since the nitride film 32 is formed under the silicon film 14 in the present embodiment, no part of the silicon film 14 is exposed to the inside of the contact hole 24 even if the contact hole 24 is enlarged in this way.

L1 shown in FIG. 4F indicates the distance between the surface of the semiconductor substrate 10 and the bottom face of the sidewall 18. When the contact hole 24 is formed according to a self-aligning technique, the contact hole 24 is tapered at a portion corresponding to the distance L1 as shown in FIG. 4E. Therefore, the distance L1 needs to be designed to such a distance as not to cause an open failure in the contact hole 24.

On the other hand, L2 shown in FIG. 4F indicates the distance between the surface of the semiconductor substrate 10 and the bottom face of the silicon film 14. A capacitance arising between wiring and the substrate 10 in a semiconductor device decreases as the surface of the semiconductor substrate 10 and the bottom face of the silicon film 14 are distant from each other. Thus, it is advantageous to increase the distance L2 for the purpose of restraining the capacitance.

In the present embodiment as described above, the bottom face of each sidewall 18 is lowered toward the semiconductor substrate 10 by about 10 nm to about 50 nm as viewed from the bottom face of the nitride film 32. Therefore, according to the structure of the present embodiment, a large difference can be ensured between the distance L1 and the distance L2 as compared with the case in which the bottom face of each sidewall 18 and the bottom face of the nitride film 32 are placed in the same height. Thus, the manufacturing method according to the present embodiment is superior to the conventional manufacturing method or the manufacturing method according to the first embodiment in terms of the restraint on the capacitance arising between wiring and the substrate 10.

Figure 4G:
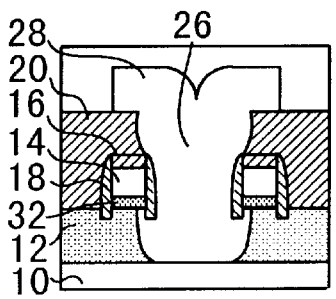

Next, a silicon film is deposited over the entire surface of a semiconductor wafer so that the contact hole 24 is filled with silicon. The silicon film is polycrystalline silicon or amorphous silicon doped with P or As and has a thickness of 50 nm to 200 nm on the interlayer oxide film 20. The so-deposited silicon is patterned in a desired shape by the dry etching such as the RIE method. As a result, a contact plug 26 and a wiring 28 are formed as shown in FIG. 4G.

According to the manufacturing method of the present embodiment as described above, the diameter of the bottom of the contact hole 24 can be enlarged without exposing the silicon film 14 to the inside of the contact hole 24. Thus, according to the manufacturing method of the present embodiment, a semiconductor device can stably be manufactured which is low in contact resistance and provides stable operating characteristics, in a manner similar to the first embodiment.

Third Embodiment

A third embodiment of the present invention will be explained below with reference to FIGS. 5A through 5G.

Figure 5A:
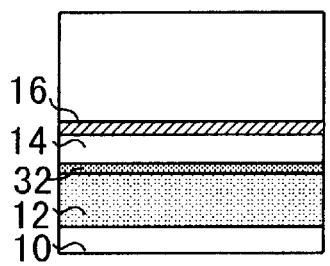
FIGS. 5A to 5G are cross-sectional views for describing a manufacturing method according to a third embodiment of the present invention.

In a manufacturing method according to the present embodiment, a laminated film of an interlayer oxide film 12, a nitride film 32, a silicon film 14 and a nitride film 16 is first formed over a semiconductor substrate 10 as shown in FIG. 5A in a manner similar to the first embodiment.

Figure 5B:
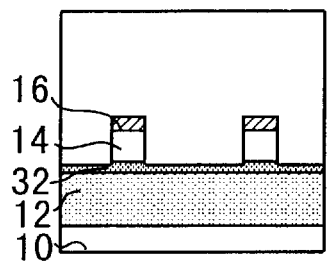

Dry etching such as a RIE method is carried out with an unillustrated photoresist as a mask to thereby pattern the nitride film 16 and the silicon film 14 in desired wiring shapes as shown in FIG. 5B. The dry etching mentioned above is finished at a stage in which a nitride film 32 has been etched to its midpoint. As a result, the nitride film 32 remains over the entire surface of a semiconductor wafer at this stage.

Figure 5C:
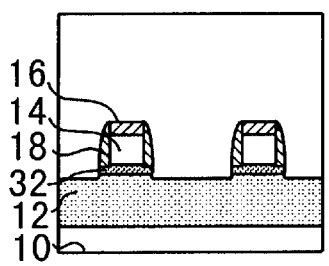

Next, a silicon nitride film is deposited over the entire surface of the semiconductor wafer with a thickness of 20 nm to 80 nm. The overall surface of the semiconductor wafer is etched back by dry etching such as the RIE method, whereby sidewalls 18 for covering the side faces of each silicon film 14 are formed as shown in FIG. 5C. In the present embodiment, the nitride film 32 remains at a lower portion of the silicon film 14 and a lower portion of each sidewall 18 at this stage.

Figure 5D:
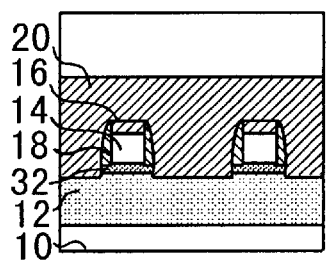

After the above-described etchback, an interlayer oxide film 20 is deposited over the entire surface of the semiconductor wafer as shown in FIG. 5D. Depositing a silicon oxide film containing no impurity with a thickness of 500 nm to 1000 nm forms the interlayer oxide film 20 by a reduced pressure or atmospheric CVD method.

As an alternative to the non-doped silicon oxide film, a silicon oxide film doped with P or B may be deposited to form the interlayer oxide film 20 in a manner similar to the first of second embodiment. In this case, the embedding characteristics and flatness of the interlayer oxide film 20 can be enhanced by performing annealing (reflow method) in an H₂O, O₂ or N₂ atmosphere. At the stage of the annealing referred to above, the nitride film 32 exists only at the lower portion of the silicon film 14 and the lower portion of each sidewall 18 as distinct from the first or second embodiment. However, since the bottom face of the silicon film 14 is covered with the nitride film 32 even in the case of the present embodiment, annealing is allowed in the H₂O or O₂ atmosphere. Therefore, the manufacturing method according to the present embodiment can also provide excellent embedding characteristics and flatness for the interlayer oxide film 20 as compared with the case in which the bottom face of the silicon film 14 is not covered with the nitride film 32.

Figure 5E:
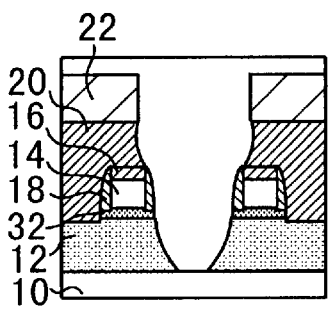

As shown in FIG. 5E, a photoresist 22 is patterned over the interlayer oxide film 20. The interlayer oxide film 20 is dry-etched by the RIE method or the like with the photoresist 22 as a mask, thereby defining a contact hole 24 therein. Since, at this time, the dry etching is done under the condition that the silicon oxide film can be removed at a higher selectivity than that for the silicon nitride film, each of the nitride film 16, the sidewalls 18 and the nitride film 32 functions as a stopper film for stopping the progress of the etching. Therefore, according to the dry etching described above, the contact hole 24 can be defined up to the semiconductor substrate 10 without exposing each silicon film 14.

Figure 5F:
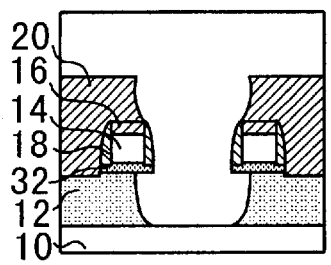

After the photoresist 22 has been removed, wet etching using HF or the like is carried out. As a result, the interlayer oxide film 12 is retreated as shown in FIG. 5F, whereby the diameter of the contact hole 24 is enlarged at the lower portion of the sidewalls 18 and the nitride film 32. The above-described wet etching is continued until the contact hole 24 exceeds an area just below the sidewalls 18 and reaches an area just below the silicon film 14. Since the nitride film 32 is formed under the silicon film 14 in the present embodiment, part of the silicon film 14 is not exposed to the inside of the contact hole 24 even if the contact hole 24 is enlarged in this way.

Figure 5G:
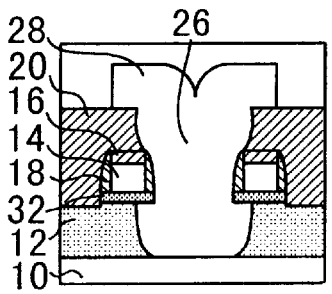

Next, a silicon film is deposited over the entire surface of the semiconductor wafer so that silicon is charged into the contact hole 24. The silicon film is polycrystalline silicon or amorphous silicon doped with P or As and has a thickness of 50 nm to 200 nm on the interlayer oxide film 20. The so-deposited silicon is patterned in each desired shape by the dry etching such as the RIE method. As a result, a contact plug 26 and a wiring 28 are formed as shown in FIG. 5G.

According to the manufacturing method of the present embodiment as described above, the diameter of the bottom of the contact hole 24 can be enlarged without the silicon film 14 being exposed to the inside of the contact hole 24. Therefore, according to the manufacturing method of the present embodiment, a semiconductor device can stably be manufactured which is low in contact resistance and provides stable operating characteristics, in a manner similar to the first embodiment.

Fourth Embodiment

Figure 2:
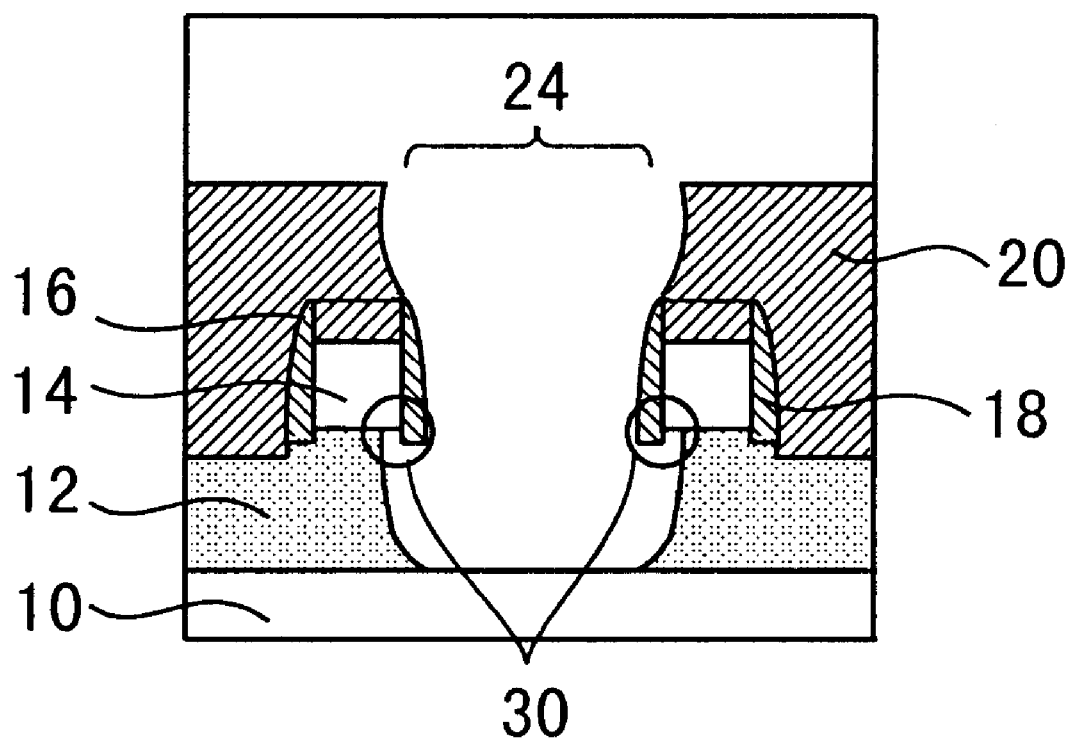
FIG. 2 is a view for describing problems developed where the technology of enlarging a contact hole is applied to the conventional manufacturing method.

A forth embodiment of the present invention will next be explained with reference to FIGS. 6A through 6I. FIGS. 6A through 6E are identical to FIGS. 1A through 1E to which reference is made in the description of the related art. Further, FIG. 6F is identical to FIG. 2 to which reference is made to describe the problem which arises where the conventional method and a process for enlarging a contact hole 24 are combined into one.

Namely, according to the manufacturing method of the present embodiment, a contact hole 24, which reaches a semiconductor substrate 10, is first defined by the conventional manufacturing method (FIGS. 6A through 6E).

Figure 6A:
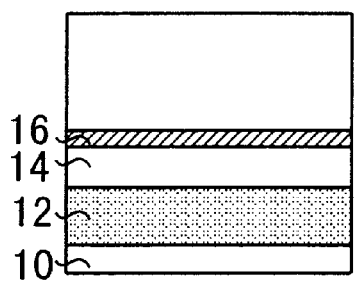
FIGS. 6A to 6I are cross-sectional views for describing a manufacturing method according to a fourth embodiment of the present invention.
Figure 6B:
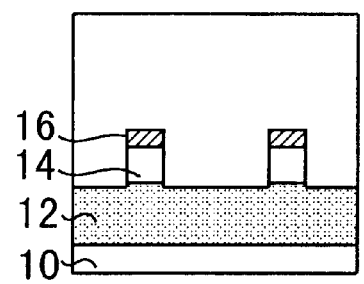
Figure 6C:
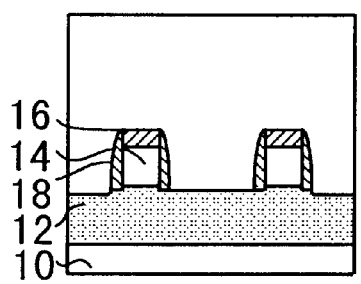
Figure 6D:
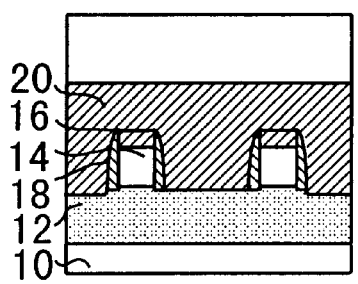
Figure 6E:
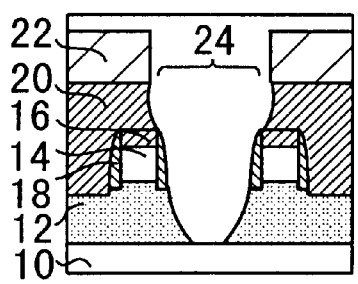
Figure 6F:
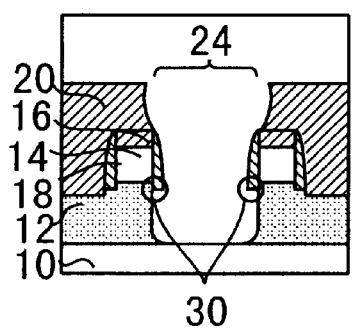

Next, the bottom of the contact hole 24 is scaled up by wet etching in such a manner that an exposed portion 30 of a silicon film 14 is formed (FIG. 6F).

Figure 6G:
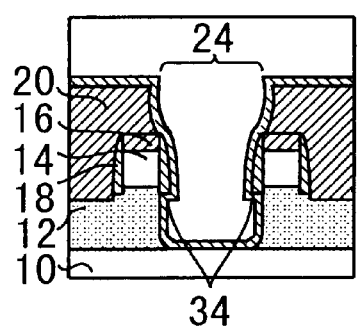

Next, a nitride film 34 is deposited inside the contact hole 24 and over an interlayer oxide film 20 with a thickness of from about 10 nm to about 50 nm by a CVD method as shown in FIG. 6G. Incidentally, the nitride film 34 may be replaced by a nitride oxide film or a laminated film of a nitride film and a nitride oxide film.

Figure 6H:
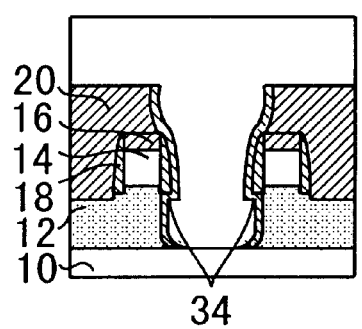

Next, the entire surface of the semiconductor wafer is etched back by dry etching such as a RIE method as shown in FIG. 6H. As a result, the nitride film 34 is removed from the surface of the interlayer oxide film 20 and the bottom of the contact hole 24. Since the nitride film 34 deposited on the side face of the contact hole 24 is not removed at this time, the exposed portion 30 of the silicon film 14 is maintained in a state covered with the nitride film 34.

Figure 6I:
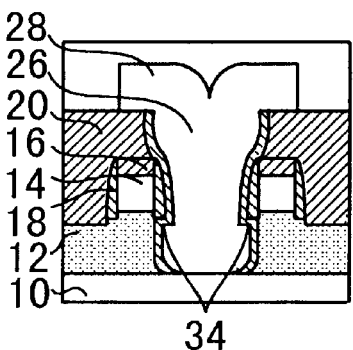

Next, a silicon film is deposited over the entire surface of the semiconductor wafer so that the contact hole 24 is filled with silicon. The silicon film is polycrystalline silicon or amorphous silicon doped with P or As and has a thickness of 50 nm to 200 nm over the interlayer oxide film 20. The so-deposited silicon is patterned in each desired shape by the dry etching such as the RIE method. As a result, a contact plug 26 and a wiring 28 are formed as shown in FIG. 6I.

According to the manufacturing method of the present embodiment as described above, the silicon film 14 can be prevented from being exposed to the inside of the contact hole 24 while the diameter of the bottom of the contact hole 24 is being enlarged. Therefore, according to the manufacturing method of the present embodiment, a semiconductor device can stably be manufactured which is low in contact resistance and provides stable operating characteristics, in a manner similar to the embodiments 1 through 3.

Since the diameter of the bottom of the contact hole 24 is enlarged as described above in the present embodiment, a large contact area is ensured between the contact plug 26 and the semiconductor substrate 10. Therefore, the manufacturing method according to the present embodiment is capable of sufficiently reducing a contact resistance between the contact plug 26 and the semiconductor substrate 10 and effectively preventing the occurrence of problems such as an increase in contact resistance, a reduction in drive capability of each transistor.

Fifth Embodiment

A fifth embodiment of the present invention will next be explained with reference to FIGS. 7, 8A through 8F and FIGS. 9A through 9F.

FIG. 7 is a plane view showing the structure of a memory cell of a DRAM.

As shown in FIG. 7, the memory cell of the DRAM is provided with active regions 40 formed on the surface of a semiconductor substrate. Each of the active regions 40 includes an impurity layer (to be described later) which functions as a source-drain region of a transistor, and a channel region which functions as a channel region of the transistor. Each individual active regions 40 are partitioned by trench isolations (to be described later) on the semiconductor substrate.

A plurality of gate electrodes 42 are formed over the semiconductor substrate with predetermined intervals left therebetween. As shown in FIG. 7, there are formed between the two gate electrodes 42 and outside thereof pad contact plugs 44, 46 and 48, which are conductive to the impurity layer of each active region 40. The pad contact plug 44 is conductive to its corresponding bit line 52 through a bit line contact plug 50. On the other hand, the pad contact plugs 46 and 48 are conductive to their corresponding storage nodes 58 and 60 through storage node contact plugs 54 and 56.

The memory cell shown in FIG. 7 is characterized in that each of the bit lines 52 and the storage node contacts 54 and 56 have a structure similar to the first embodiment referred to above. A method of manufacturing the memory cell shown in FIG. 7 will be explained below with reference to FIGS. 8A through 9F.

FIGS. 8A through 9F are a series of cross-sectional views for describing the method of manufacturing the memory cell shown in FIG. 7. In these drawings, those represented in the left row of the sheet (indicated by A, C or E) are cross-sectional views obtained by cutting the memory cell along line A–A' shown in FIG. 7, respectively. Drawings represented in the right row of the sheet (indicated by B, D or F) are cross-sectional views obtained by cutting the memory cell along line B–B' shown in FIG. 7, respectively.

Figure 8A:
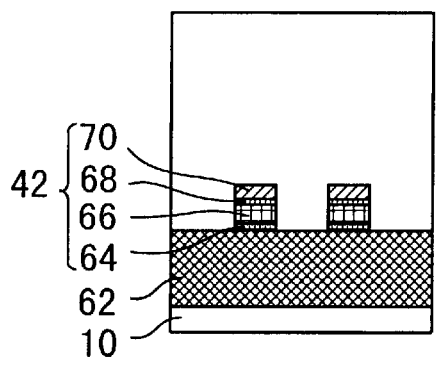
FIGS. 8A to 9F are cross-sectional views for describing a manufacturing method according to the fifth embodiment of the present invention.
Figure 8B:
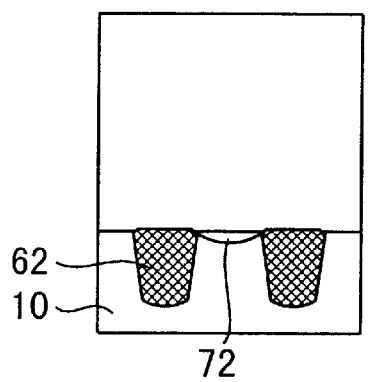

In the manufacturing method according to the present embodiment, trench isolations 62 for partitioning each individual active regions are first formed in the vicinity of the surface of the semiconductor substrate 10 as shown in FIGS. 8A and 8B. Next, a gate oxide film 64 and a gate electrode 42 are formed on the semiconductor substrate 10. The gate electrode 42 comprises a silicon film 66, a silicon oxide film 68 and a silicon nitride film 70 respectively deposited by a reduced pressure CVD method.

The silicon film 66 included in the gate electrode 42 is a doped silicon film of polycrystalline silicon or amorphous silicon and contains an impurity such as P or As or the like. The silicon film 66 may be replaced by, for example, a silicide film comprised of a high melting point metal film such as Ti, TiN or W, a laminated film of the doped silicon film and the silicide film, or a conductive metal film such as W, Al.

In the manufacturing method according to the present embodiment, an impurity layer 72, which serves as a source-drain region of a transistor, is next formed on its corresponding active region of the semiconductor substrate 10 as shown in FIG. 8B.

Next, a silicon nitride film is deposited over the entire surface of a semiconductor wafer by the reduced pressure CVD method. The entire surface of the semiconductor wafer is etched back by dry etching such as a RIE method to thereby form sidewalls 74 for covering the side faces of each gate electrode 42 as shown in FIG. 8C.

Figure 8C:
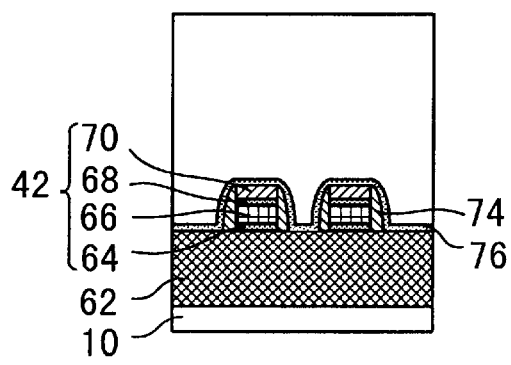
Figure 8D:
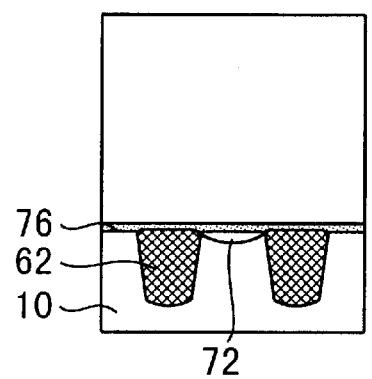

Thereafter, a silicon nitride film 76 is deposited over the entire surface of the semiconductor wafer by the reduced pressure CVD method as shown in FIGS. 8C and 8D.

Figure 8E:
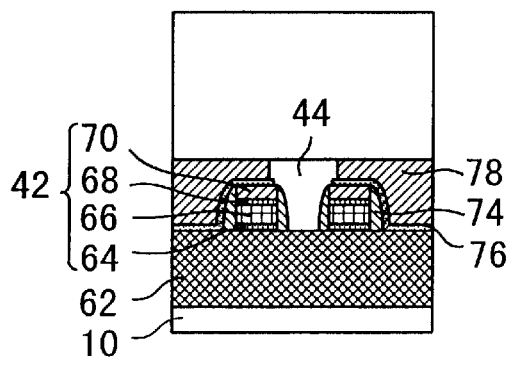
Figure 8F:
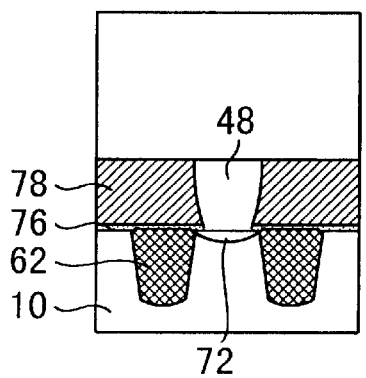

Next, as shown in FIGS. 8E and 8F, an interlayer oxide film 78 doped with an impurity such as P or B is deposited over the entire surface of the semiconductor wafer by the reduced pressure or atmospheric CVD. The interlayer oxide film 78 is subjected to reflow processing to enhance its embedding characteristics and flatness. Pad contact holes each of which reaches the active region of the semiconductor substrate 10, are defined in the interlayer oxide film 78 by a self-aligning manner.

Next, polycrystalline silicon or amorphous silicon doped with P or As is deposited over the entire surface of the semiconductor wafer so that each pad contact hole is filled with silicon. The so-deposited silicon is etched back by dry etching such as the RIE method to thereby form pad contact plugs 44 and 48 embedded in the interlayer oxide film 78.

Subsequently, bit lines 52, storage node contact plugs 54 or the like are formed by applying the manufacturing method according to the first embodiment.

Figure 9A:
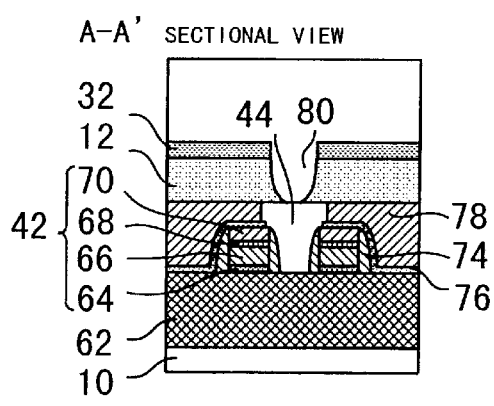
Figure 9B:
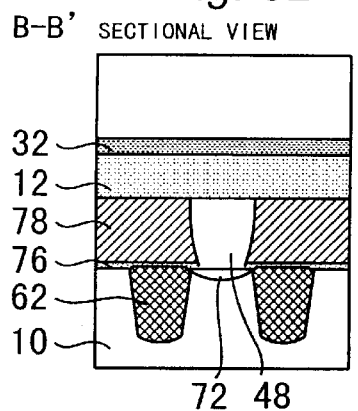

Namely, when the pad contact plugs 44 and 48 are formed by the above-described series of processes, an interlayer oxide film 12 and a nitride film 32 are next formed over the interlayer oxide film 78 as shown in FIGS. 9A and 9B. In the interlayer oxide film 12 and the nitride film 32 is formed a bit line contact hole 80 opening up to the pad contact plug 44 at a predetermined position.

Figure 9C:
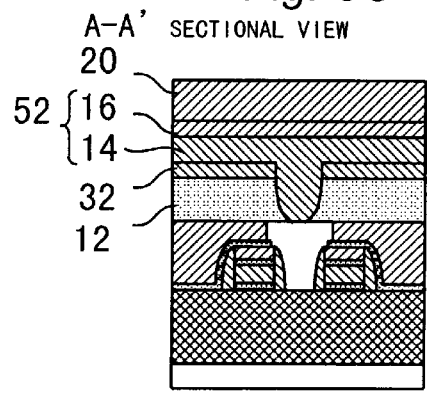
Figure 9D:
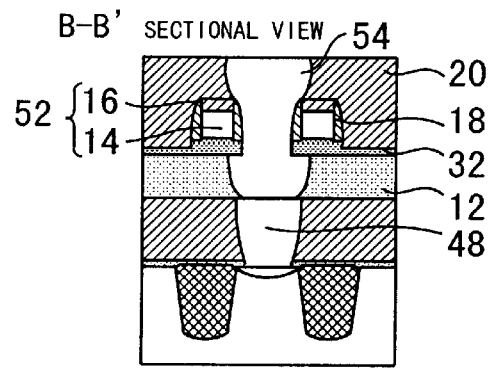

Thereafter, a silicon film 14 and a nitride film 16, which turn to components of the bit line 52, are deposited over the nitride film 32 as shown in FIG. 9C. Further, the processing is put forward according to the method of the first embodiment (see FIGS. 3A through 3H), whereby a storage node contact plug 54 (corresponding to the plug 26 and wiring 28 employed in the first embodiment) conductive to its corresponding pad contact plug 48 is formed as shown in FIG. 9D.

According to the above-described manufacturing method, the bottom of the storage node contact plug 54 can greatly be enlarged without short-circuiting the silicon film 14 used as a wiring layer of each bit line 52 and the storage node contact plug 54. Therefore, according to the manufacturing method of the present embodiment, the contact resistance between the storage node contact plug 54 and the pad contact plug 48 can be controlled low sufficiently without making a short circuit between each bit line 52 and the storage node contact plug 54.

Figure 9E:
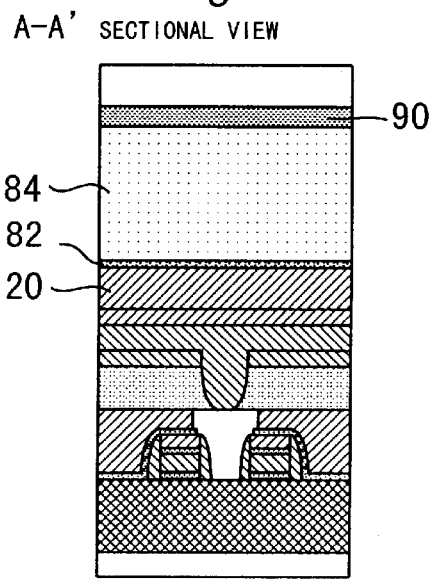

In the present embodiment, a silicon nitride film 82 is next deposited over its corresponding interlayer oxide film 20 as shown FIG. 9E by the reduced pressure CVD. A silicon oxide film 84 doped with P or B is further deposited on the silicon nitride film 82 by the reduced pressure or atmospheric CVD.

Figure 9F:
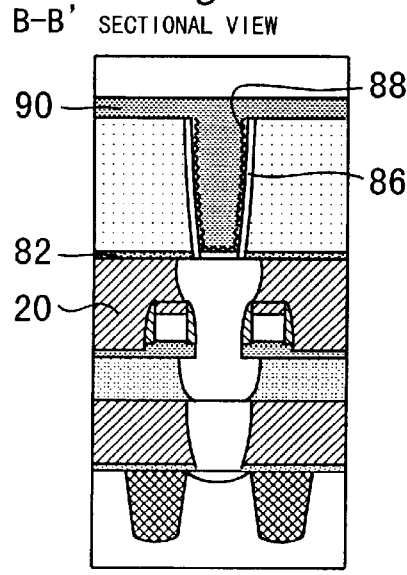

Afterwards, a space for forming a storage node of each capacitor is defined inside the silicon oxide film 84 by dry etching such as the RIE method as shown in FIG. 9F. A polycrystalline silicon film, amorphous silicon film doped with P and As, or a laminated film of those films is formed within the space as a lower electrode 86 of the capacitor.

When the lower electrode 86 is composed of the amorphous silicon, a method of charging an $SiH_4$ gas into a furnace to thereby apply the nuclei of Si to the surface of the silicon oxide film 84 and thereafter charging a $PH_3$ gas therein and growing a Si crystal by executing high-temperature annealing is generally carried out. According to this method, the surface of the lower electrode 86 can be brought to conductive granular crystalline.

A capacitor insulating film 88 is deposited on the surface of the lower electrode 86. A so-called ON film obtained by subjecting the surface of a silicon nitride film deposited by a CVD method to thermal oxidation or a $Ta_2O_5$ film is used as the capacitor insulating film 88. An upper electrode 90 is deposited on the capacitor insulating film 88. When the capacitor insulating film 88 is of the ON film, the upper electrode 90 can be formed by depositing the polycrystalline or amorphous silicon film doped with P or As by the CVD method. On the other hand, when the capacitor insulating film 88 is of the $Ta_2O_5$ film, the upper electrode 90 can be formed of a high melting point metal film such as Ti, TiN.

Sixth Embodiment

A sixth embodiment of the present invention will next be described with reference to FIGS. 10A through 10D together with FIGS. 9A and 9B.

In a manufacturing method according to the present embodiment, the structure shown in FIGS. 9A and 9B is manufactured according to a procedure similar to the fifth embodiment. A bit line 52, a storage node contact plug 54, and the like are next formed by applying the manufacturing method according to the second embodiment.

Figure 10A:
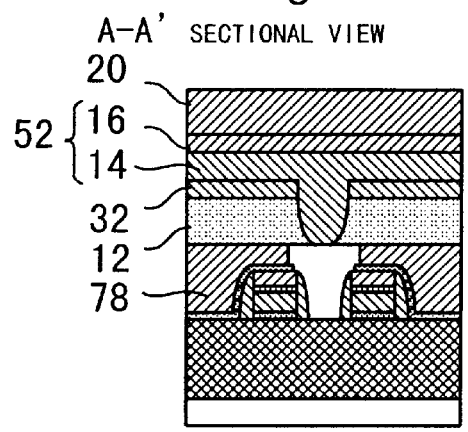
FIGS. 10A to 10D are cross-sectional views for describing a manufacturing method according to a sixth embodiment of the present invention.
Figure 10B:
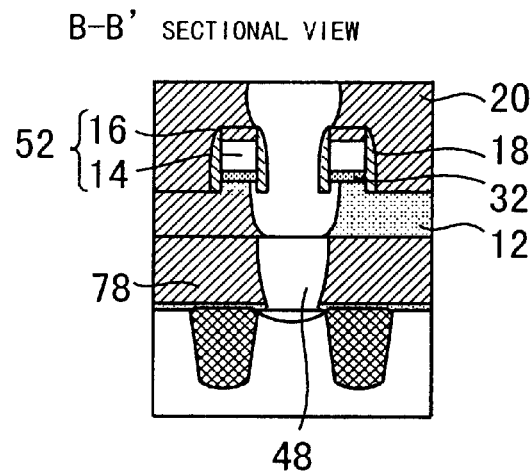

Namely, in the present embodiment, a silicon film 14 and a nitride film 16, which turn to components of the bit line 52, are deposited over a nitride film 32 as shown in FIG. 10A after the bit line contact hole 80 has been defined according to a technique similar to the fifth embodiment (FIGS. 9A and 9B). Further, the processing is put forward according to the method of the second embodiment (see FIGS. 4A through 4G) to thereby form sidewalls 18 extended downward from the bottom face of the nitride film 32 as well as the storage node contact plug 54 (corresponding to the plug 26 and wiring 28 employed in the second embodiment) conductive to its corresponding pad contact plug 48 as shown in FIG. 10B.

According to the aforementioned manufacturing method, the bottom of the storage node contact plug 54 can be enlarged on a large scale without short-circuiting the silicon film 14 used as a wiring layer of the bit line 52 and the storage node contact plug 54. Further, according to the manufacturing method of the present embodiment, a large interval can be ensured between the interlayer oxide film 78 and the silicon film 14 whereby wiring capacitance in a memory cell is reduced to a sufficient degree. Therefore, according to the manufacturing method of the present embodiment, a DRAM, which exhibits excellent electrical characteristics, can stably be manufactured.

Figure 10C:
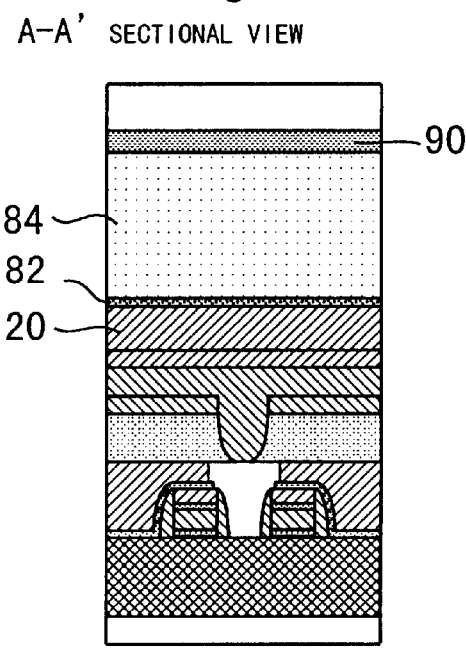
Figure 10D:
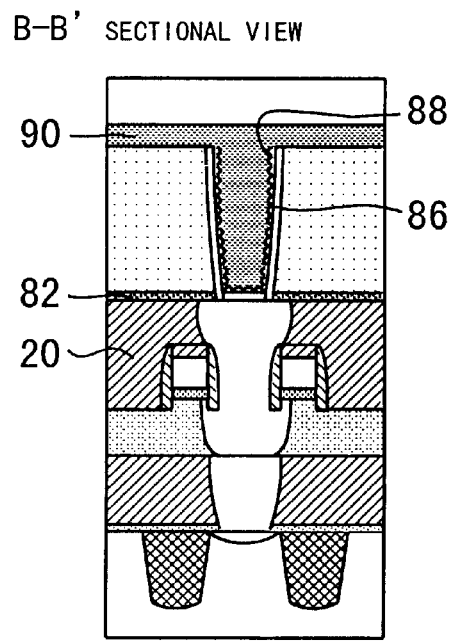

A lower electrode 86 of a capacitor, a capacitor insulating film 88, an upper electrode 90 thereof, and the like are subsequently formed according to a procedure similar to the fifth embodiment, whereby a memory cell structure shown in FIGS. 10C and 10D is implemented.

Seventh Embodiment

A seventh embodiment of the present invention will next be described with reference to FIGS. 11A through 11D together with FIGS. 9A and 9B.

In a manufacturing method according to the present embodiment, the structure shown in FIGS. 9A and 9B is manufactured according to a procedure similar to the fifth embodiment. A bit line 52, a storage node contact plug 54, and the like are next formed by applying the manufacturing method according to the third embodiment.

Figure 11A:
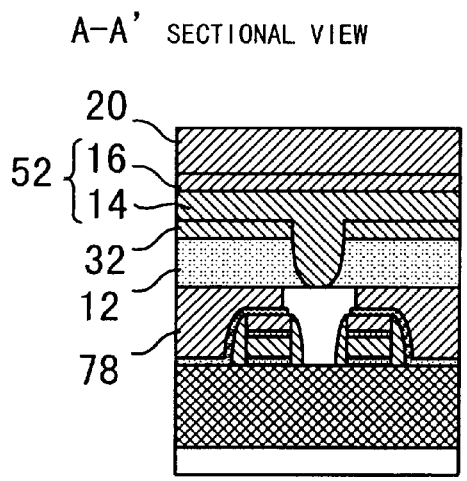
FIGS. 11A to 11D are cross-sectional views for describing a manufacturing method according to a seventh embodiment of the present invention.
Figure 11B:
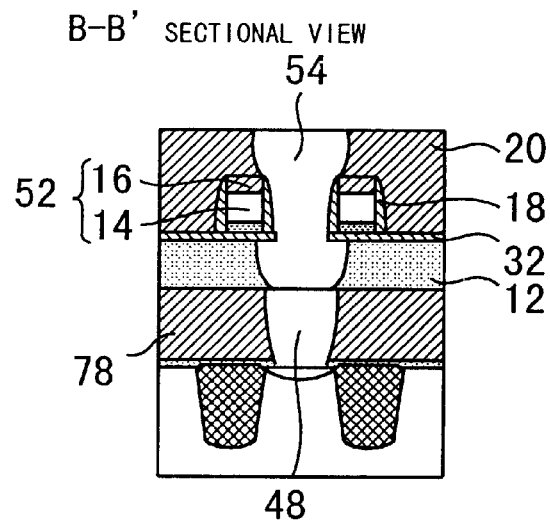

Namely, in the present embodiment, a silicon film 14 and a nitride film 16, which turn to components of the bit line 52, are deposited over a nitride film 32 as shown in FIG. 11A after a bit line contact hole 80 has been defined according to a technique similar to the fifth embodiment (FIGS. 9A and 9B). Further, the processing is put forward according to the method of the third embodiment (see FIGS. 5A through 5G) to thereby form the nitride film 32 which exists only below the silicon film 14 and below sidewalls 18 as well as a storage node contact plug 54 (corresponding to the plug 26 and wiring 28 employed in the third embodiment) conductive to its corresponding pad contact plug 48 as shown in FIG. 11B.

According to the aforementioned manufacturing method, the bottom of the storage node contact plug 54 can be enlarged on a large scale without short-circuiting the silicon film 14 used as a wiring layer of the bit line 52 and the storage node contact plug 54. Therefore, according to the manufacturing method of the present embodiment, the contact resistance between the storage node contact plug 54 and the pad contact plug 48 can be controlled low sufficiently without making a short circuit between each bit line 52 and the storage node contact plug 54.

Figure 11C:
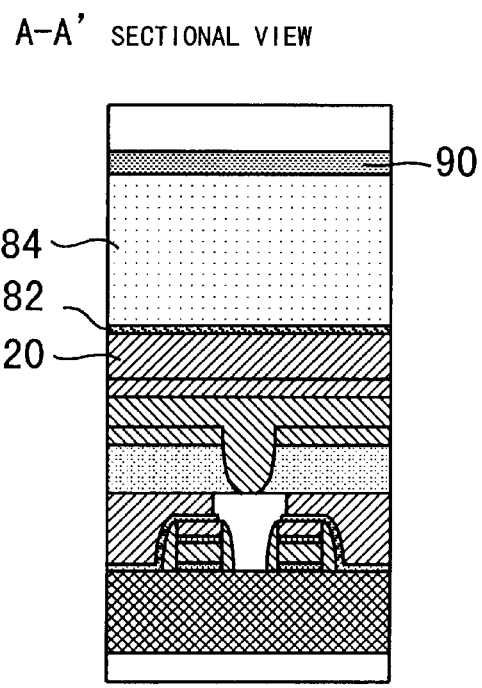
Figure 11D:
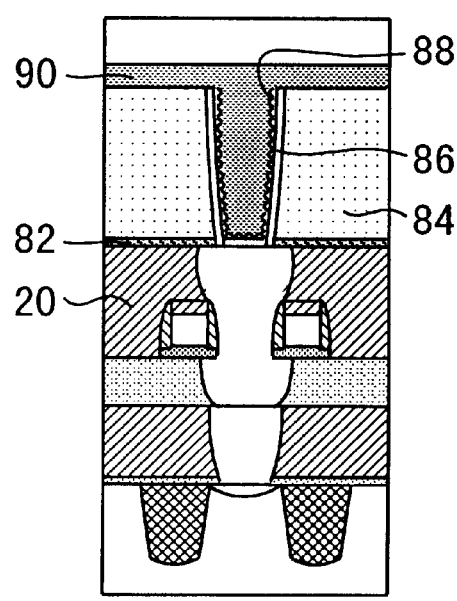

A lower electrode 86 of a capacitor, a capacitor insulating film 88, an upper electrode 90 thereof, and the like are subsequently formed according to a procedure similar to the fifth embodiment, whereby a memory cell structure shown in FIGS. 11C and 11D is implemented.

Eighth Embodiment

An eighth embodiment of the present invention will next be described with reference to FIGS. 12A through 12F together with FIGS. 8E and 8F.

In a manufacturing method according to the present embodiment, the structure shown in FIGS. 8E and 8F is manufactured according to a procedure similar to the fifth embodiment. Then, a bit line 52, a storage node contact plug 54, and the like are formed by applying the manufacturing method according to the fourth embodiment.

Figure 12A:
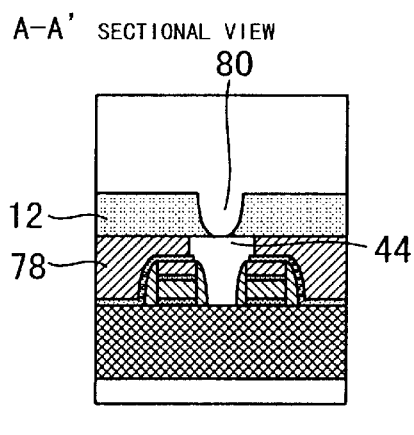
FIGS. 12A to 12F are cross-sectional views for describing a manufacturing method according to an eighth embodiment of the present invention.
Figure 12B:
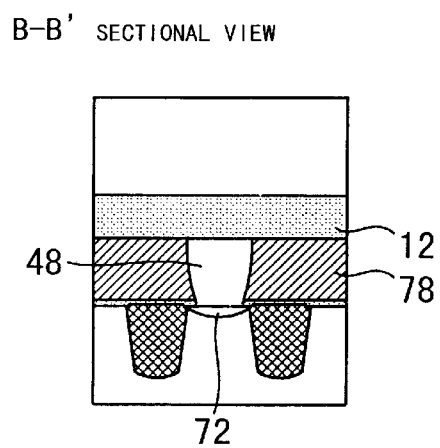

Namely, in the present embodiment, pad contact plugs 44 and 48 are formed according to a technique similar to the fifth embodiment (FIGS. 8E and 8F). Afterwards, an interlayer oxide film 12 is further formed on an interlayer oxide film 78 as shown in FIGS. 12A and 12B. Each bit line contact hole 80 defined up to its corresponding pad contact plug 44 is defined in the interlayer oxide film 12 in desired place.

Figure 12C:
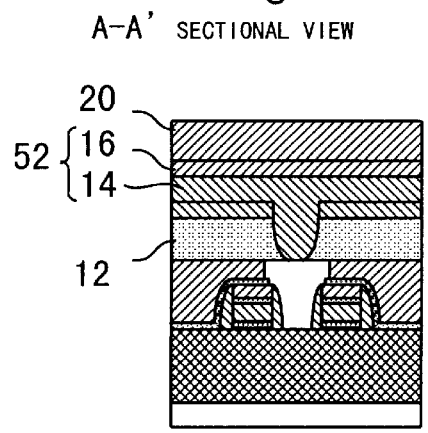
Figure 12D:
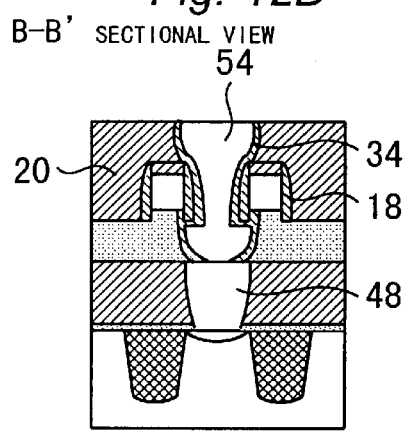
Figure 12E:
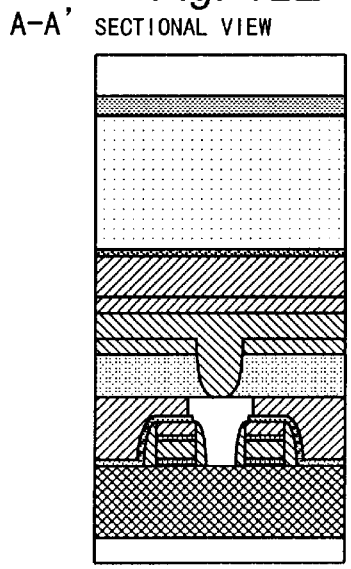
Figure 12F:
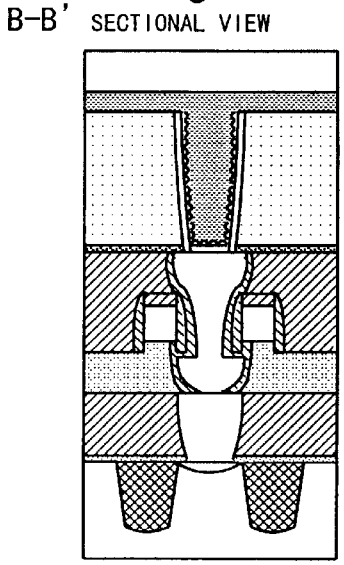

Next, a silicon film 14 and a nitride film 16, which turn to components for each bit line 52, are deposited over the interlayer oxide film 12 as shown in FIG. 12C. Further, the processing is put forward according to the method of the fourth embodiment (see FIGS. 6A through 6I), whereby a storage node contact plug 54 (corresponding to the plug 26 and wiring 28 employed in the fourth embodiment) conductive to its corresponding pad contact plug 48 is formed together with a nitride film 34 for covering the side of a storage node contact hole as shown in FIG. 12D.

According to the above-described manufacturing method, the bottom of the plug 54 can greatly be enlarged without short-circuiting the silicon film 14 used as a wiring layer of each bit line 52 and the storage node contact plug 54. Therefore, according to the manufacturing method of the present embodiment, the contact resistance between the storage node contact plug 54 and the pad contact plug 48 can be controlled low sufficiently without making a short circuit between each bit line 52 and the storage node contact plug 54.

Ninth Embodiment

A ninth embodiment of the present invention will next be described with reference to FIGS. 13 and 14.

Figure 13:
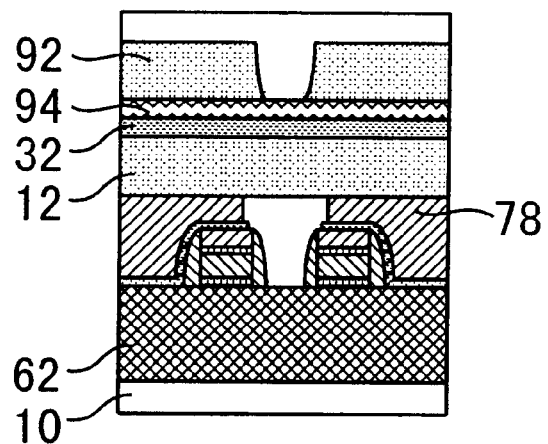
FIG. 13 is a cross-sectional view of a memory cell at the time that an etching step for defining a bit line contact hole is started in the manufacturing method according to the fifth embodiment of the present invention.

FIG. 13 shows a cross sectional view of a memory cell, which is taken along line A–A' at the time that the etching step for defining the bit line contact hole 80 is started in the fifth embodiment. FIG. 14 shows a cross sectional view of a memory cell, which is taken along line A–A' at the time that similar etching is started in the present embodiment.

In the aforementioned fifth embodiment, etching for defining the bit line contact hole 80 is executed in a state in which the interlayer oxide film 12 is covered with the nitride film 32. In this case, there is need to form an anti-reflection film 94 such as an organic ARC on the nitride film 32 for the purpose of patterning a photoresist 92 by photolithography with enough accuracy.

Figure 14:
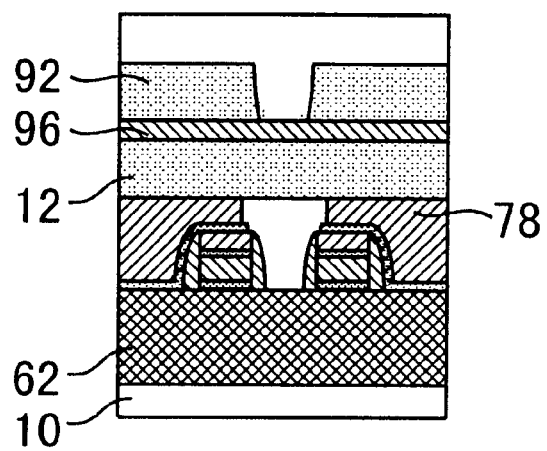
FIG. 14 is a cross-sectional view of a memory cell at the time that an etching step for defining a bit line contact hole is started in a manufacturing method according to a ninth embodiment of the present invention.

In a manufacturing method according to the present embodiment, a plasma nitride film (p-SiON film) 96 containing oxygen is formed on the interlayer oxide film 12 as an alternative to the nitride film 32 as shown in FIG. 14. The manufacturing method according to the present embodiment is identical to the manufacturing method according to the fifth embodiment except for the above-described point.

The p-SiON film 96 is allowed to function as a stopper film in a manner similar to the nitride film 32 upon dry etching of a silicon oxide film. Further, the p-SiON film 96 can also be used as an anti-reflection film upon photolithography. Therefore, according to the manufacturing method of the present embodiment, a photo resist 92 can be patterned with high accuracy without forming the anti-reflection film 94 on the p-SiON film 96. For this reason, according to the manufacturing method of the present embodiment, a memory cell can be manufactured by fewer steps as compared with the manufacturing method according to the fifth embodiment.

While the aforementioned ninth embodiment has described the case in which the p-SiON film 96 has been utilized in combination with the method of the fifth embodiment, the manufacturing method usable in combination with the p-SiON film 96 is not limited to the method of the fifth embodiment. Namely, the p-SiON film 96 may be utilized in combination with the manufacturing method of the sixth or seventh embodiment.

Since the present invention is constructed in the above-described manner, the following advantageous effects are brought about.

According to a first aspect of the present invention, since the bottom face of a wiring is covered with a lower insulating film, no short-circuit is developed between the wiring and a contact plug even if a contact hole is provided with an enlarged portion. Further, according to the present invention, since the substantially entire surface of an interlayer oxide film is covered with the lower insulating film, the wiring can effectively be prevented from being oxidized upon reflow of the interlayer oxide film. Therefore, the present invention implements a semiconductor device stable in characteristic.

According to a second aspect of the present invention, the bottom face of each sidewall positions closer to a substrate layer than does the bottom face of a lower insulating film. Such a configuration ensures a large interval between the substrate layer and wiring without causing an opening failure of a contact hole. Therefore, the present invention implements a semiconductor device with small wiring capacitance.

According to a third aspect of the present invention, the bottom face of each sidewall positions closer to a substrate layer than does the bottom face of a lower insulating film by 10 nm or more. Therefore, the present invention sufficiently reduces wiring capacitance lying within the semiconductor device.

According to a fourth aspect of the present invention, a step developed between the bottom face of each sidewall and the bottom face of a lower insulating film is set to within 50 nm. Therefore, the present invention efficiently reduces the wiring capacitance with a practical structure.

According to a fifth aspect of the present invention, a wiring exposed to the inside of a contact hole due to the enlargement of the contact hole can be covered with a short-circuit proof film. Therefore, according to the present invention, a short-circuit between the wiring and a contact plug can reliably be prevented even if no lower insulating film is formed under the wiring.

According to a sixth aspect of the present invention, a short-circuit proof film can be formed of a nitride based insulating film which is suitable to easily ensure an enough etching selectivity with respect to a silicon oxide film.

According to a seventh aspect of the present invention, a lower insulating film, an upper insulating film, sidewalls or the like can be formed of a silicon nitride film which is suitable to easily ensure an enough etching selectivity with respect to a silicon oxide film.

According to a eighth aspect of the present invention, a lower insulating film, an upper insulating film, sidewalls or the like can be formed of a silicon nitride oxide film which is suitable to easily ensure an enough etching selectivity with respect to a silicon oxide film.

According to a ninth aspect of the present invention, advantageous result of a reduction in contact resistance due to the scaling up of a contact hole can be implemented in a memory cell of a DRAM.

According to a tenth aspect of the present invention, the simplification of steps can be achieved by using a lower insulating film as an anti-reflection film.

Further, the present invention is not limited to these embodiments, but variations and modifications may be made without departing from the scope of the present invention.

What is claimed is:

1. A semiconductor device having a contact hole defined between adjacent two wirings by a self-aligning manner, comprising:
   a contact plug formed in said contact hole;
   a substrate layer conductive to the bottom face of said contact plug;
   an interlayer oxide film formed on said substrate layer;
   a lower insulating film formed of a nitride based insulating film so as to cover the entire surface of said interlayer oxide film except for said contact hole portion;
   said two wirings formed on said lower insulating film with said contact hole interposed therebetween;
   an upper insulating film formed of a nitride based insulating film with the same width as said each wiring so as to cover the upper surface of said each wiring; and
   sidewalls formed of a nitride based insulating film so as to cover the side faces of said each wiring and the side faces of said upper insulating film,
   wherein said contact hole has an enlarged portion formed in the same layer as said interlayer oxide film, which has a diameter larger than an interval defined between said two wirings.

2. A semiconductor device having a contact hole defined between adjacent two wirings by a self-aligning manner, comprising:
   a contact plug formed in said contact hole;
   a substrate layer conductive to the bottom face of said contact plug;
   an interlayer oxide film formed on said substrate layer;
   said two wirings formed in a layer above said interlayer oxide film with said contact hole interposed therebetween;
   a lower insulating film formed of a nitride based insulating film between said interlayer oxide film and said each wiring with the same width as said each wiring;
   an upper insulating film formed of a nitride based insulating film so as to cover the upper surface of said each wiring with the same width as said each wiring; and
   sidewalls formed of a nitride based insulating film so as to cover the side faces of said each wiring and the side faces of said upper and lower insulating films,
   wherein said contact hole has a diameter larger than an interval defined between said two wirings within the same layer as said interlayer oxide film, and
   the bottom face of said each sidewall is shifted toward said substrate layer by a predetermined length as compared with the bottom face of said lower insulating film.

3. The semiconductor device according to claim 2, wherein said predetermined length is a value of 10 nm or more.

4. The semiconductor device according to claim 3, wherein said predetermined length is a value of 50 nm or less.

5. A semiconductor device having a contact hole defined between adjacent two wirings by a self-aligning manner, comprising:
   a contact plug formed in said contact hole;
   a substrate layer conductive to the bottom face of said contact plug;
   an interlayer oxide film formed on said substrate layer;
   said two wirings formed on said interlayer oxide film with said contact hole interposed therebetween;
   an upper insulating film formed of a nitride based insulating film so as to cover the upper surface of said each wiring with the same width as said wiring;
   sidewalls formed of a nitride based insulating film so as to cover the side faces of said each wiring and the side faces of said upper insulating film; and
   a short-circuit proof film formed of a single insulating material so as to cover the entire side face of said contact plug,
   wherein said contact hole has a diameter larger than an interval defined between said two wirings within the same layer as said interlayer oxide film.

6. The semiconductor device according to claim 5, wherein said short-circuit proof film is formed of a nitride based insulating film.

7. The semiconductor device according to claim 1, wherein said nitride based insulating film includes a silicon nitride film.

8. The semiconductor device according to claim 2, wherein said nitride based insulating film includes a silicon nitride film.

9. The semiconductor device according to claim 5, wherein said nitride based insulating film includes a silicon nitride film.

10. The semiconductor device according to claim 1, wherein said nitride based insulating film includes a silicon nitride oxide film.

11. The semiconductor device according to claim 2, wherein said nitride based insulating film includes a silicon nitride oxide film.

12. The semiconductor device according to claim 5, wherein said nitride based insulating film includes a silicon nitride oxide film.

13. The semiconductor device according to claim 1, wherein said substrate layer includes a gate electrode formed on a semiconductor substrate, an interlayer insulating film for covering said gate electrode, and a plurality of pad contact plugs which extend through said interlayer insulating film so as to be conductive to a source-drain region of said semiconductor substrate, said each wiring is a bit line formed over said substrate layer; and said contact plug is a storage node contact plug which passes between said bit lines and is thereby conductive to one of said plurality of pad contact plugs, and said semiconductor device further comprising:

a bit line contact plug which extends through said lower insulating film and said interlayer oxide film to thereby bring said bit line and part of said plurality of pad contact plugs to a conducting state, and a capacitor formed on said storage node contact plug.

14. The semiconductor device according to claim 2, wherein said substrate layer includes a gate electrode formed on a semiconductor substrate, an interlayer insulating film for covering said gate electrode, and a plurality of pad contact plugs which extend through said interlayer insulating film so as to be conductive to a source-drain region of said semiconductor substrate, said each wiring is a bit line formed over said substrate layer; and said contact plug is a storage node contact plug which passes between said bit lines and is thereby conductive to one of said plurality of pad contact plugs, and said semiconductor device further comprising:

a bit line contact plug which extends through said lower insulating film and said interlayer oxide film to thereby bring said bit line and part of said plurality of pad contact plugs to a conducting state, and a capacitor formed on said storage node contact plug.

15. The semiconductor device according to claim 13, wherein said lower insulating film is a plasma nitride film containing oxygen.

16. The semiconductor device according to claim 14, wherein said lower insulating film is a plasma nitride film containing oxygen.

17. The semiconductor device according to claim 5, wherein said substrate layer includes a gate electrode formed on a semiconductor substrate, an interlayer insulating film for covering said gate electrode, and a plurality of pad contact plugs which extend through said interlayer insulating film so as to be conductive to a source-drain region of said semiconductor substrate, said each wiring is a bit line formed over said substrate layer; and said contact plug is a storage node contact plug which passes between said bit lines and is thereby conductive to one of said plurality of pad contact plugs, and said semiconductor device further comprising:

a bit line contact plug which extends through said interlayer oxide film to thereby bring said bit line and part of said plurality of pad contact plugs to a conducting state, and a capacitor formed on said storage node contact plug.

* * * * *

UNITED STATES PATENT AND TRADEMARK OFFICE
CERTIFICATE OF CORRECTION

PATENT NO.    : 6,653,739 B2
DATED         : November 25, 2003
INVENTOR(S)   : Takashi Terauchi, et al.

It is certified that error appears in the above-identified patent and that said Letters Patent is hereby corrected as shown below:

<u>Title page,</u>
Item [73], Assignee, change "Mitsubishi Denki Kabushiki Kaisha, Tokyo (JP)" to -- Renesas Technology Corp., Tokyo (JP) --

Signed and Sealed this

Fourth Day of May, 2004

JON W. DUDAS
*Acting Director of the United States Patent and Trademark Office*